United States Patent
Chen et al.

(10) Patent No.: US 9,230,941 B2
(45) Date of Patent: Jan. 5, 2016

(54) BONDING STRUCTURE FOR STACKED SEMICONDUCTOR DEVICES

(71) Applicant: Taiwan Semiconductor Manufacturing Company, Ltd., Hsin-Chu (TW)

(72) Inventors: Szu-Ying Chen, Toufen Township (TW); Dun-Nian Yaung, Taipei (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 0 days.

(21) Appl. No.: 14/229,114

(22) Filed: Mar. 28, 2014

(65) Prior Publication Data
US 2015/0279816 A1    Oct. 1, 2015

(51) Int. Cl.
| | |
|---|---|
| *H01L 23/00* | (2006.01) |
| *H01L 25/065* | (2006.01) |
| *H01L 25/00* | (2006.01) |
| *H01L 23/522* | (2006.01) |
| *H01L 23/528* | (2006.01) |
| *H01L 21/768* | (2006.01) |

(52) U.S. Cl.
CPC ...... *H01L 25/0657* (2013.01); *H01L 21/76877* (2013.01); *H01L 23/528* (2013.01); *H01L 23/5226* (2013.01); *H01L 24/03* (2013.01); *H01L 24/09* (2013.01); *H01L 24/89* (2013.01); *H01L 25/50* (2013.01); *H01L 2224/0382* (2013.01); *H01L 2224/08146* (2013.01); *H01L 2224/09515* (2013.01); *H01L 2224/8034* (2013.01); *H01L 2224/8036* (2013.01); *H01L 2224/80894* (2013.01); *H01L 2225/06524* (2013.01); *H01L 2225/06541* (2013.01); *H01L 2924/206* (2013.01); *H01L 2924/2064* (2013.01)

(58) Field of Classification Search
CPC ........... H01L 2224/73265; H01L 2224/48227; H01L 2224/48247
USPC .................. 257/777, 421, 432, 443, E31, 124, 257/E31.111
See application file for complete search history.

(56) References Cited

U.S. PATENT DOCUMENTS

| | | | |
|---|---|---|---|
| 2009/0102059 A1* | 4/2009 | Ishii .............................. | 257/774 |
| 2009/0263674 A1* | 10/2009 | Liu et al. ...................... | 428/598 |
| 2010/0200898 A1* | 8/2010 | Lin et al. ...................... | 257/294 |
| 2011/0304008 A1* | 12/2011 | Yang ............................. | 257/506 |

* cited by examiner

*Primary Examiner* — Nathan Ha
(74) *Attorney, Agent, or Firm* — Slater & Matsil, L.L.P.

(57) ABSTRACT

A semiconductor device, and a method of fabrication, is introduced. In an embodiment, one or more passivation layers are formed over a first substrate. Recesses are formed in the passivation layers and a first bonding pad, a second bonding pad, and a first via are formed in the recesses. In some embodiment, the first via may have electrical contact with the first bonding pad and may provide an electrical pathway to a first plurality of metallization layers. The first bonding pad and the second bonding pad in the first substrate are aligned to a third bonding pad and the fourth bonding pad in a second substrate and may be bonded using a direct bonding method. A bond between the first bonding pad and the third bonding pad may provide an electrical pathway between devices on the first substrate and devices on the second substrate.

20 Claims, 5 Drawing Sheets

BONDING STRUCTURE FOR STACKED SEMICONDUCTOR DEVICES

BACKGROUND

Semiconductor manufacturers face a constant challenge to comply with Moore's Law. They constantly strive to continually decrease feature sizes, such as sizes of active and passive devices, interconnecting wire widths and thicknesses, and power consumption as well as increase device density, wire density and operating frequencies. These smaller electronic components also require smaller packages that utilize less area than packages of the past, in some applications.

Three dimensional integrated circuits (3DICs) are a recent development in semiconductor packaging in which multiple semiconductor dies are stacked upon one another, such as package-on-package (PoP) and system-in-package (SiP) packaging techniques. Some methods of forming 3DICs involve bonding together two or more semiconductor wafers, and active circuits such as logic, memory, processor circuits and the like located on different semiconductor wafers. The commonly used bonding techniques include direct bonding, chemically activated bonding, plasma activated bonding, anodic bonding, eutectic bonding, glass frit bonding, adhesive bonding, thermo-compressive bonding, reactive bonding and/or the like. Once two semiconductor wafers are bonded together, the interface between two semiconductor wafers may provide an electrically conductive path between the stacked semiconductor wafers.

One advantageous feature of stacked semiconductor devices is that much higher density can be achieved by employing stacked semiconductor devices. Furthermore, stacked semiconductor devices can achieve smaller form factors, cost-effectiveness, increased performance and lower power consumption.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
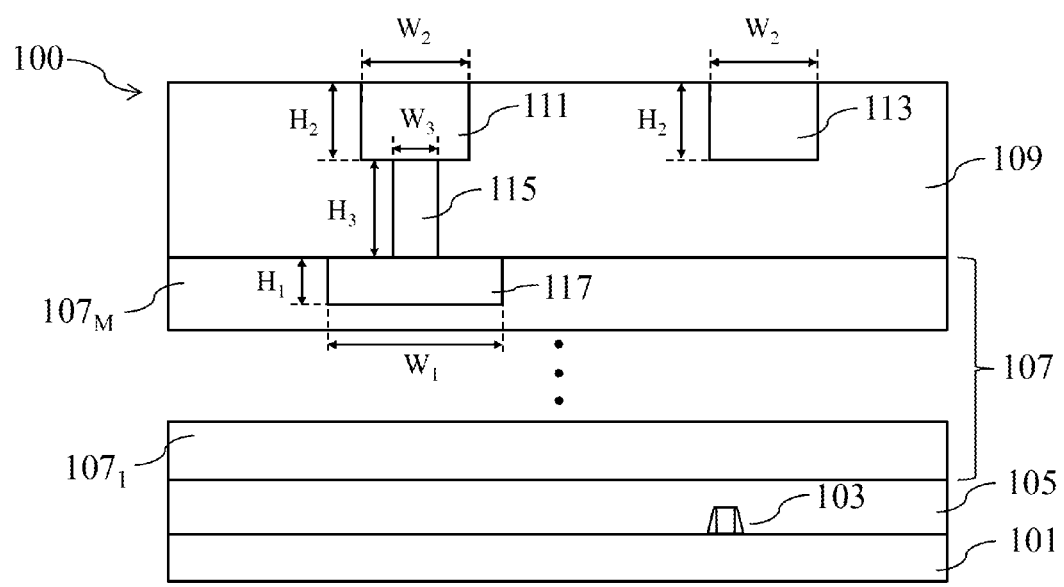
FIGS. 1-4 are cross-sectional views illustrating wafer bonding process, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure will be described with respect to embodiments in a specific context, namely, a method for wafer bonding. Hereinafter, various embodiments will be explained in detail with reference to the accompanying drawings.

With reference to FIG. 1, there is shown a partial cross-sectional view of a first wafer 100. The first wafer 100 may include a first substrate 101, a first plurality of devices 103 on the first substrate 101. The first substrate 101 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

The first plurality of devices 103 are represented in FIG. 1 as a single transistor. However, the first plurality of devices 103 may comprise a wide variety of active and passive devices such as transistors, diodes, capacitors, resistors, inductors and the like, which may be used to generate the desired structural and functional requirements of the design for the first wafer 100. The first plurality of devices 103 may be formed using any suitable methods either within or on the surface of the first substrate 101, or in an overlying dielectric layer. One of ordinary skill in the art will appreciate that the above examples are provided for illustrative purposes only to further explain applications of some illustrative embodiments and are not meant to limit the disclosure in any manner.

In further reference to FIG. 1, there is shown a first interlayer dielectric (ILD) layer 105 over the first plurality of devices 103. The first ILD layer 105 is formed over the first substrate 101 and the first plurality of devices 103 and is designed to isolate the first plurality of devices 103 from the first plurality of metallization layers 107. The first ILD layer 105 may comprise silicon dioxide, low-K dielectric materials (materials having a dielectric constant lower than silicon dioxide), such as silicon oxynitride, phosphosilicate glass (PSG), borophosphosilicate glass (BPSG), fluorinated silicate glass (FSG), organosilicate glasses (OSG), SiOxCy, Spin-On-Glass, Spin-On-Polymers, silicon carbon material, compounds thereof, composites thereof, combinations thereof, or the like, deposited by any suitable method, such as spin-on, chemical vapor deposition (CVD), and plasma-enhanced CVD (PECVD), or the like. Porous versions of the above materials may also be used. These materials and processes are provided as examples and other materials and processes may be used.

In further reference to FIG. 1, there are shown a first plurality of metallization layers 107 over the first ILD layer 105, and a first conductive pad 117 in the first plurality of metallization layers 107. The first plurality of metallization layers 107 are formed over the first ILD layer 105 and are designed to connect the first plurality of devices 103 to form functional circuitry. The first plurality of metallization layers 107 are formed of alternating inter-metal dielectric (IMD) layers, and conductive material and may be formed through any suitable process (such as deposition, damascene, dual damascene, etc.). In an embodiment, the first plurality of metallization layers 107 may comprise a first number M of layers, from a first bottom metallization layer $107_1$ to a first top metallization layer $107_M$. Persons skilled in the art should realize that the precise number of the first plurality of metallization layers 107 is dependent upon the design of the first wafer 100.

The first conductive pad 117 is formed in the first top metallization layer $107_M$. The first conductive pad 117 may comprise copper, silver, gold, tungsten, aluminum, or other suitable conductive materials, and may be deposited using PVD, CVD, PECVD, plating, or similar. The first conductive pad 117 may comprise one or more barrier layers (not shown) to protect the dielectric material in the adjacent regions from diffusion and metallic poisoning. The barrier layer may comprise titanium, titanium nitride, tantalum, tantalum nitride, or other alternatives. The barrier layer may be formed using PVD, CVD, or the like. In an embodiment, the first conductive pad 117 may have a first height $H_1$ between about 90 nm and about 900 nm, and a first width $W_1$ between about 0.09 µm and about 0.4 µm. One of ordinary skill in the art will appreciate that the above examples are provided for illustrative purposes only to further explain applications of some illustrative embodiments and number and geometry of conductive pads may vary according to specifications for the first wafer 100.

It should also be noted that one or more etch stop layers (not shown) may be positioned between adjacent layers, e.g., between the first ILD layer 105 and the first substrate 101. Generally, the etch stop layers provide a mechanism to stop an etching process when forming vias and/or contacts. The etch stop layers are formed of a dielectric material having a different etch selectivity from adjacent layers, e.g., the underlying first substrate 101 and the overlying first ILD layer 105. In an embodiment, etch stop layers may be formed of SiN, SiCN, SiCO, CN, combinations thereof, or the like, deposited by CVD or PECVD techniques.

In further reference to FIG. 1, there are shown a first passivation layer 109 over the first plurality of metallization layers 107, a first hybrid bonding pad 111 and a second hybrid bonding pad 113 in the first passivation layer 109, and a via 115 in the first passivation layer 109. The first passivation layer 109 is formed over the first top metallization layer $107_M$. The first passivation layer 109 may comprise of one or more layers comprising silicon dioxide, undoped silicon glass (USG), silicon oxynitride (SiON), phosphosilicate glass (PSG), SiN, compounds thereof, composites thereof, combinations thereof, or the like, deposited by any suitable method, such as spin-on, chemical vapor deposition (CVD), and plasma-enhanced CVD (PECVD), or the like. These materials and processes are provided as examples and other materials and processes may be used. One of ordinary skill in the art will appreciate that the above examples are provided for illustrative purposes only and the number of passivation layers and materials used may vary according to the specification of the first wafer 100.

As will be described in greater detail below, hybrid bonding pads are formed in the first passivation layer 109. In some embodiments, the hybrid bonding pads may provide dual functionality. The hybrid bonding pads may be used during a packaging process to bond the first wafer 100 to another wafer. Moreover, the hybrid bonding pads may provide electrical connections between the first plurality of devices 103 on the first wafer 100 and devices on another wafer. In other embodiments, some of the bonding pads, such as the second hybrid bonding pad 113, may be dummy bonding pads and may not provide electrical contacts between wafers. The dummy bonding pads may be beneficial for improving bonding strength between bonded wafers, as well as for mitigating adverse effects from planarization processes, such as metal dishing and dielectric delamination.

The first hybrid bonding pad 111, the second hybrid bonding pad 113, and the via 115 may comprise copper, silver, gold, tungsten, aluminum, or other suitable conductive materials, and may be deposited using PVD, CVD, PECVD, plating, or similar. The first hybrid bonding pad 111 and the second hybrid bonding pad 113 are subsequently used to bond different wafers. In an embodiment, the first hybrid bonding pad 111 may also provide electrical contacts between the different wafers, since the first hybrid bonding pad 111 is electrically connected to the first plurality of metallization layers 107 using the via 115. In an embodiment, the second hybrid bonding pad 113 may be a dummy bonding pad and lack an electrical contact to the first plurality of metallization layers 107. In addition, the first hybrid bonding pad 111, the second hybrid bonding pad 113, and the via 115 may comprise one or more barrier layers (not shown) to protect the first passivation layer 109 from diffusion and metallic poisoning. The barrier layer may comprise titanium, titanium nitride, tantalum, tantalum nitride, or other alternatives. The barrier layer may be formed using PVD, CVD, or the like. One of ordinary skill in the art will appreciate that the above examples are provided for illustrative purposes only to further explain applications of some illustrative embodiments and number and geometry of hybrid bonding pads and vias may vary according to specifications for the first wafer 100.

Photolithography techniques may be used to pattern the first passivation layer 109. Generally, a photoresist layer (not shown) is formed over the first passivation layer 109 and then exposed to radiation such as ultraviolet light or an excimer laser through a reticle (not shown), in accordance with a desired pattern. A bake or cure operation may be performed, and a developer may be used to remove either the exposed or unexposed portions of the photoresist layer, depending on whether a positive or negative resist is utilized. Thus, a pattern that is used to form openings (not shown) in the first passivation layer 109 is formed in the photoresist layer. The specific pattern of the openings, as described herein, is for illustrative purposes only, and other patterns may be formed depending on the design of the first wafer 100.

The first passivation layer 109 is etched, for example, by an anisotropic dry etch process to remove exposed portions of the first passivation layer 109. Such etching further forms the openings in the first passivation layer 109. Multiple etch processes may be utilized to etch through the various layers of the first passivation layer 109. Subsequently, the photoresist layer is removed using, for example, an ashing process in combination with a wet clean process.

In further reference to FIG. 1, a conductive material is deposited to fill the openings in the first passivation layer 109 and form the first hybrid bonding pads 111, the second hybrid bonding pads 113, and the via 115. The conductive material may comprise copper, silver, gold, tungsten, aluminum, and the like, and may be deposited using PVD, CVD, PECVD, plating, or similar. The barrier layer (not shown) formed in the openings of the first passivation layer 109 to protect the first passivation layer 109 from diffusion and metallic poisoning from a subsequently formed conductive material in the openings. The barrier layer may be formed having a single layer or multiple layers and may comprise titanium, titanium nitride, tantalum, tantalum nitride, or other alternatives. The barrier layer may be formed using PVD, CVD, or the like.

Subsequently, chemical mechanical polishing (CMP) is performed to remove excess portions of the barrier layer and/or the conductive material from an upper surface of the first passivation layer 109. The remaining conductive material in the openings of the first passivation layer 109 form the first hybrid bonding pad 111, the second hybrid bonding pad 113, and the via 115. In an embodiment, the first hybrid bonding pad 111 and the second hybrid bonding pad 113 may have a second width $W_2$ between about 600 nm and about 3000 nm, and a second height $H_2$ between about 90 nm and about 900 nm. In an embodiment, the via 115 may have a third width $W_3$ between about 0.1 µm and about 0.4 µm, and a third height $H_3$ between about 100 nm and about 400 nm.

As will be discussed in detail below, the first wafer 100 is bonded to another wafer. In some embodiments, the first wafer 100 and the other wafer may be formed using same manufacturing processes. In other embodiments, the first wafer 100 and the other wafer may be formed using different manufacturing processes. The first wafer 100 and the other wafer may be formed, for example, by a CMOS process, by a MEMS process, or similar. In some embodiments, the first wafer 100 may be an application-specific integrated circuit (ASIC) wafer and the other wafer may be a CMOS image sensor (CIS) wafer.

Figure 2:
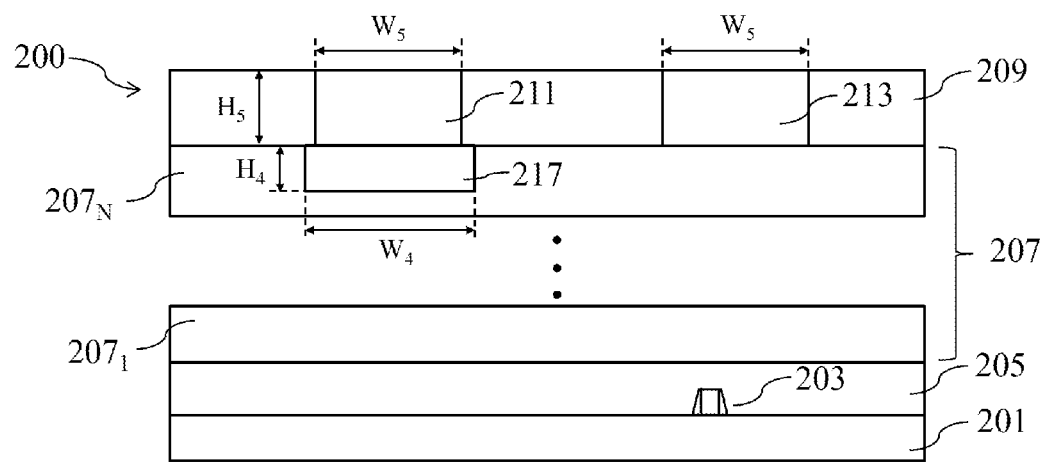

With reference to FIG. 2, there is shown a cross-sectional view of a second wafer 200, which may be bonded to the first wafer 100 of FIG. 1 in some embodiments. In some embodiments, the first wafer 100 and the second wafer 200 may be formed using same manufacturing processes, and, unless noted otherwise, reference numerals "2xx" of FIG. 2 refer to the same features and processes as reference numerals "1xx" of FIG. 1. In addition, a subscript "N" may be different from the subscript "M."

In reference to FIG. 2, in an embodiment, a second conductive pad 217 may have a fourth height $H_4$ between about 100 nm and about 900 nm, and a fourth width $W_4$ between about 0.09 µm and about 0.4 µm. One of ordinary skill in the art will appreciate that the above examples are provided for illustrative purposes only to further explain applications of some illustrative embodiments, and the number and geometry of conductive pads may vary according to specifications for the second wafer 200.

In further reference to FIG. 2, a third hybrid bonding pad 211 and a fourth hybrid bonding pad 213 are formed in the second passivation layer 209 using similar materials and methods as the first hybrid bonding pad 111 and the second hybrid bonding pad 113 in the first passivation layer 109. In some embodiments, the third hybrid bonding pad 211 may have a direct electrical contact with the second conductive pad 217 in the second top metallization layer $207_N$. In an embodiment, the fourth hybrid bonding pad 213 may be a dummy bonding pad and lack an electrical contact to the second top metallization layer $207_N$, but may have a direct physical contact to an IMD layer of the second top metallization layer $207_N$. The second wafer 200 may be formed using less manufacturing steps compared to the first wafer, due to the lack of an extra via in the second passivation layer 209, for example, between the third hybrid bonding pad 211 and the second conductive pad 217. In an embodiment, the third hybrid bonding pad 211 and the fourth hybrid bonding pad 213 may have a fifth width $W_5$ between about 200 nm and about 2600 nm, and a fifth height $H_5$ between about 100 nm and about 900 nm. One of ordinary skill in the art will appreciate that the above examples are provided for illustrative purposes only to further explain applications of some illustrative embodiments and number and geometry of hybrid bonding pads may vary according to specifications for the second wafer 200.

Figure 3:
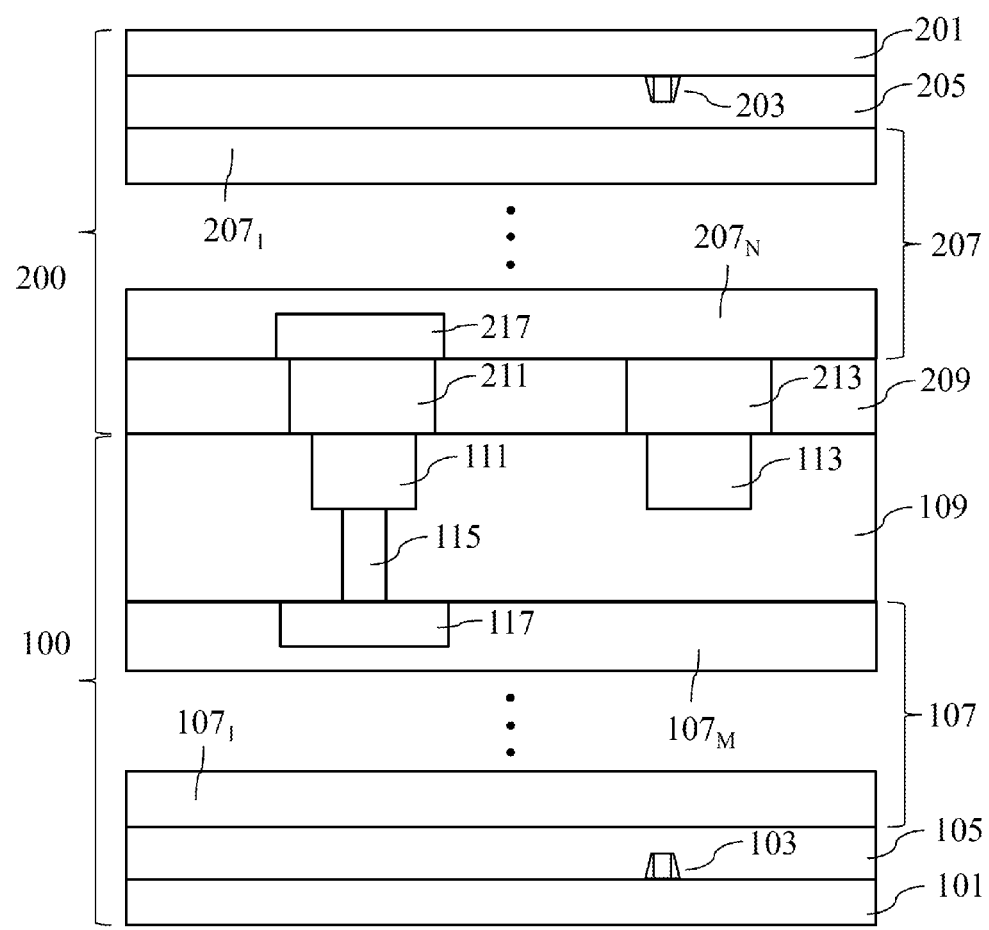

In reference to FIG. 3, the first wafer 100 is bonded to the second wafer 200. To prepare the first wafer 100 and the second wafer 200 for bonding, surface cleaning and surface activation of the first wafer 100 and the second wafer 200 is performed. The surface cleaning is performed to remove CMP slurry and native oxide layers from surfaces of the first wafer 100 and the second wafer 200. The surface cleaning process may include methods with direct and non-direct contact with the surfaces of the first wafer 100 and the second wafer 200, such as cryogenic cleaning, mechanical wiping and scrubbing, etching in a gas, plasma or liquid, ultrasonic and megasonic cleaning, laser cleaning, and the like. Subsequently, the second wafer 200 may be rinsed in de-ionized (DI) water and dried using a spin dryer or an isopropyl alcohol (IPA) dryer. In other embodiments, the first wafer 100 and the second wafer 200 may be cleaned using RCA clean, or the like.

In further reference to FIG. 3, the first wafer 100 is bonded to the second wafer 200. In an embodiment, the second wafer 200 is represented as being similar to the first wafer 100. However, one of ordinary skill in the art will appreciate that the above example is provided for illustrative purposes only to further explain applications of some illustrative embodiments and are not meant to limit the disclosure in any manner. In some embodiments, the second wafer 200 may comprise devices and circuitry that is different from the first wafer 100. For example, in other embodiments, the first wafer 100 may be fabricated using a CMOS process while the second wafer 200 may be manufactured using a MEMS process. As another example, in some embodiments, the first wafer 100 may be an application-specific integrated circuit (ASIC) wafer and the second wafer 200 may be a CMOS image sensor (CIS) wafer.

In an embodiment, the first wafer 100 and the second wafer 200 may be bonded using, for example, a direct bonding process such as metal-to-metal bonding (e.g., copper-to-copper bonding), dielectric-to-dielectric bonding (e.g., oxide-to-oxide bonding), metal-to-dielectric bonding (e.g., oxide-to-copper bonding), hybrid bonding (e.g., simultaneous metal-to-metal and dielectric-to-dielectric bonding), any combinations thereof and/or the like. The surface activation may be performed to prepare the first wafer 100 and the second wafer 200 for bonding. The surface activation process may include suitable processes, such as plasma etch or wet etch processes to remove native oxides, which may be formed after the wafer cleaning process, from the surfaces of the first wafer 100 and the second wafer 200. Subsequently, the first wafer may be rinsed in de-ionized (DI) water and dried using a spin dryer or an isopropyl alcohol (IPA) dryer.

For example, the first wafer 100 and the second wafer 200 may be bonded using hybrid bonding. The first hybrid bonding pad 111 and the second hybrid bonding pad 113 of the first wafer 100 are aligned to a third hybrid bonding pad 211 and a fourth hybrid bonding pad 213 of the second wafer 200, respectively. For example, in some embodiments, the surfaces of the first wafer 100 and the second wafer 200 may be put into physical contact at room temperature, atmospheric pressure, and ambient air, and the first hybrid bonding pad 111 and the third hybrid bonding pad 211 as well as the second hybrid bonding pad 113 and the fourth hybrid bonding pad 213 may be bonded using direct metal-to-metal bonding. At the same time, the first passivation layer 109 of the first wafer 100 and the second passivation layer 209 of the second wafer 200 may be bonded using direct dielectric-to-dielectric bonding. Subsequently, annealing may be performed to enhance the bonding strength between the first wafer 100 and the second wafer 200.

It should be noted that the bonding may be at wafer level, wherein the first wafer 100 and the second wafer 200 are bonded together, and are then singulated into separated dies. Alternatively, the bonding may be performed at the die-to-die level, or the die-to-wafer level.

Embodiments such as those discussed above allow designers to more freely place dummy bonding pads where needed without as much concern of or without affecting the underlying metallization layers. For example, the first wafer 100 utilizes the via 115 to electrically couple the first hybrid bonding pad 111 to the corresponding underlying first conductive pad 117. By using the via 115 for the active bonding pads, the second hybrid bonding pad 113, which acts as a dummy bonding pad, may be placed as needed without additional processing steps by omitting a via under the second hybrid bonding pad 113 in the via pattern used in the patterning process. As a result, the second hybrid bonding pad 113 may be placed directly over a conductive element without shorting.

Such an arrangement also allows dummy pads to be placed as needed on the second wafer 200. For example, bonding pads on the second wafer 200 are placed directly over the second plurality of metallization layers 207 without an intervening via. Even if the fourth hybrid bonding pad 213, which acts as a dummy pad, were placed directly over and contacting the underlying second conductive pad 217, since the fourth hybrid bonding pad 213 is bonded to the second hybrid bonding pad 113 on the first wafer 100, and because the second hybrid bonding pad 113 is separated from the underlying conductive layer by a dielectric layer, no short or electrical connection is made.

This allows the second hybrid bonding pad 113 to be placed as needed because a via would be omitted, and the fourth hybrid bonding pad 213 to be placed as needed regardless of whether the fourth hybrid bonding pad 213 contacts an underlying conductive element because the fourth hybrid bonding pad 213 is bonded to the second hybrid bonding pad 113, which is electrically isolated.

Figure 4:
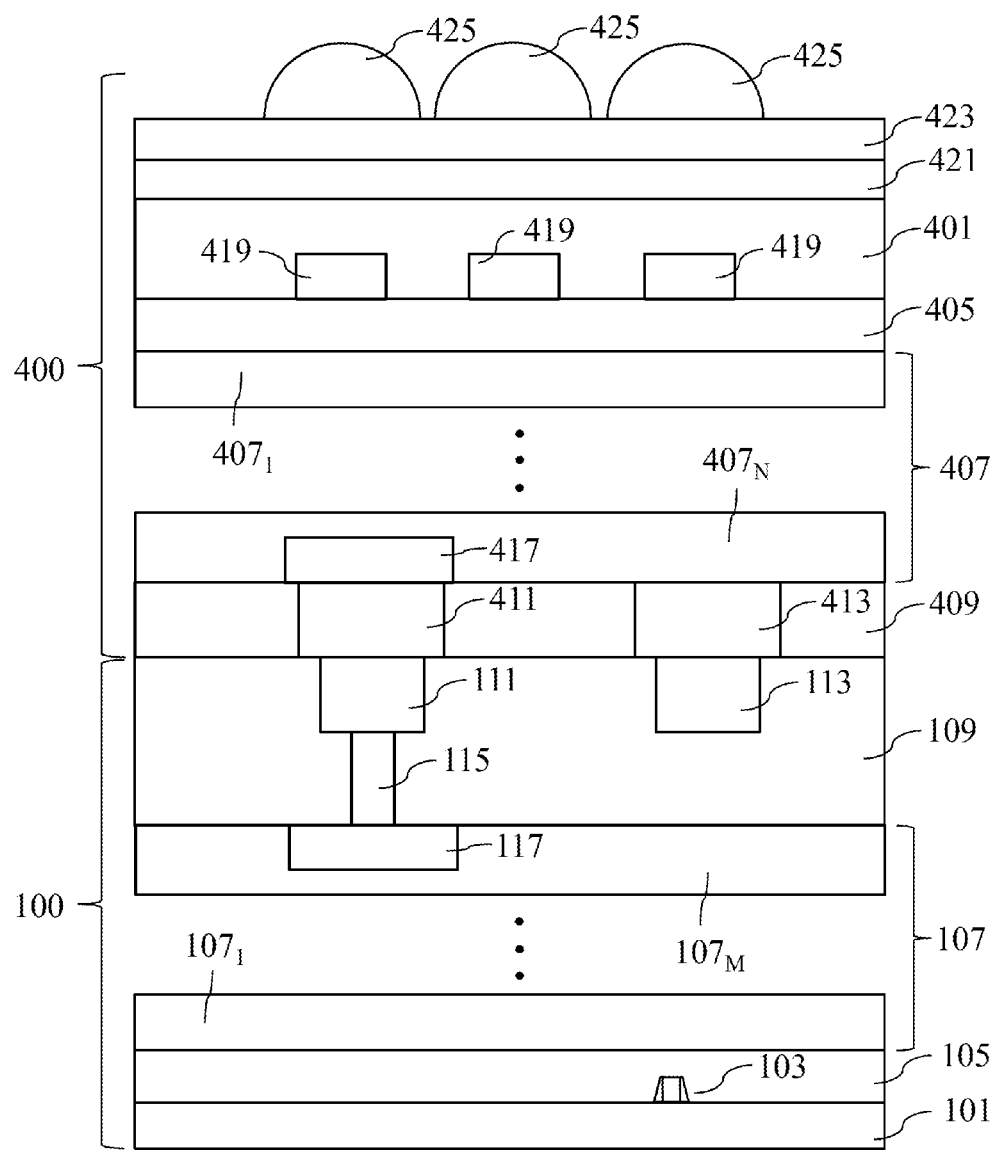

With reference to FIG. 4, there is shown a cross-sectional view of a third wafer 400, which may be bonded to the first wafer 100 of FIG. 1 in some embodiments. In some embodiments, the second wafer 200 of the FIG. 2 and the third wafer 400 may be formed using same manufacturing processes, and, unless noted otherwise, reference numerals "4xx" of FIG. 4 refer to the same features and processes as reference numerals "2xx" of FIG. 2.

In some embodiments, the third wafer 400 is a backside-illuminated (BSI) CIS and the first wafer 100 is a logic circuit, such as an ASIC wafer. In this embodiment, an array of photo-active regions 419 is formed in the third substrate 401. The photo-active regions 419, such as photo-diodes are formed, for example, by implanting impurity ions into the third substrate 401. Furthermore, the photo-active regions 419 may be a PN junction photo-diode, a PNP photo-transistor, an NPN photo-transistor or the like. In some embodiments, the photo-active regions 419 may be separated from each other by isolation regions (not shown), such as shallow trench isolation (STI) regions, suitably doped wells formed by ion-implantation, and the like.

A bottom anti-reflective coating (BARC) structure 421 is formed on a backside of the third substrate 401 as illustrated in FIG. 4. In the illustrated embodiment, the BARC structure 421 may comprise one or more layers of dielectric materials, such as silicon oxide, hafnium oxide ($HfO_2$), tantalum oxide ($Ta_2O_5$), and the like. The BARC structure 421 may be formed by any acceptable process, such as CVD or the like.

A color filter layer 423 is formed over the BARC structure 421. In some embodiments, the color filter layer 423 comprises a dielectric layer, for example, a silicon oxide layer with color filters (not individually shown) formed therein. The color filters may be used to allow specific wavelengths of light to pass while reflecting other wavelengths, thereby allowing the BSI CIS to determine the color of the light being received by the photo-active regions 419. The color filters may vary, such as being a red, green, and blue filter as used in a Bayer pattern. Other combinations, such as cyan, yellow, and magenta, may also be used. The number of different colors of the color filters may also vary. The color filters may comprise a polymeric material or resin, such as a polymeric polymer, polymethyl-methacrylate (PMMA), polyglycidyl-methacrylate (PGMA), or the like, that includes colored pigments. In some embodiments, reflective guide layers (not shown) are formed along sidewalls of the color filters. The reflective guide layers are formed of a metal or other high refractive index material that is capable of reflecting light, such as copper, aluminum, tantalum nitride, titanium nitride, tungsten, silicon nitride, the like, or a combination thereof.

An array of microlenses 425 are formed over the color filter layer 423. In some embodiments, the microlenses 425 are aligned with respective color filters in the color filter layer 423 and the photo-active regions 419 in the third substrate 401. The microlenses 425 may be formed of any material that may be patterned and formed into lenses, such as a high transmittance acrylic polymer. In an embodiment, a microlens layer may be formed using a material in a liquid state by, for example, spin-on techniques. Other methods, such as deposition techniques like CVD, PVD, or the like, may also be used. The planar material for the microlens layer may be patterned using photolithography and etch techniques to pattern the planar material in an array corresponding to the array of the photo-active regions 419. The planar material may then be reflowed to form an appropriate curved surface for the microlenses 425, and the microlenses 425 can be cured using a UV treatment. Subsequently, the first wafer 100 is bonded to the third wafer 400 using a method similar to one described above with reference to FIG. 3.

Figure 5:
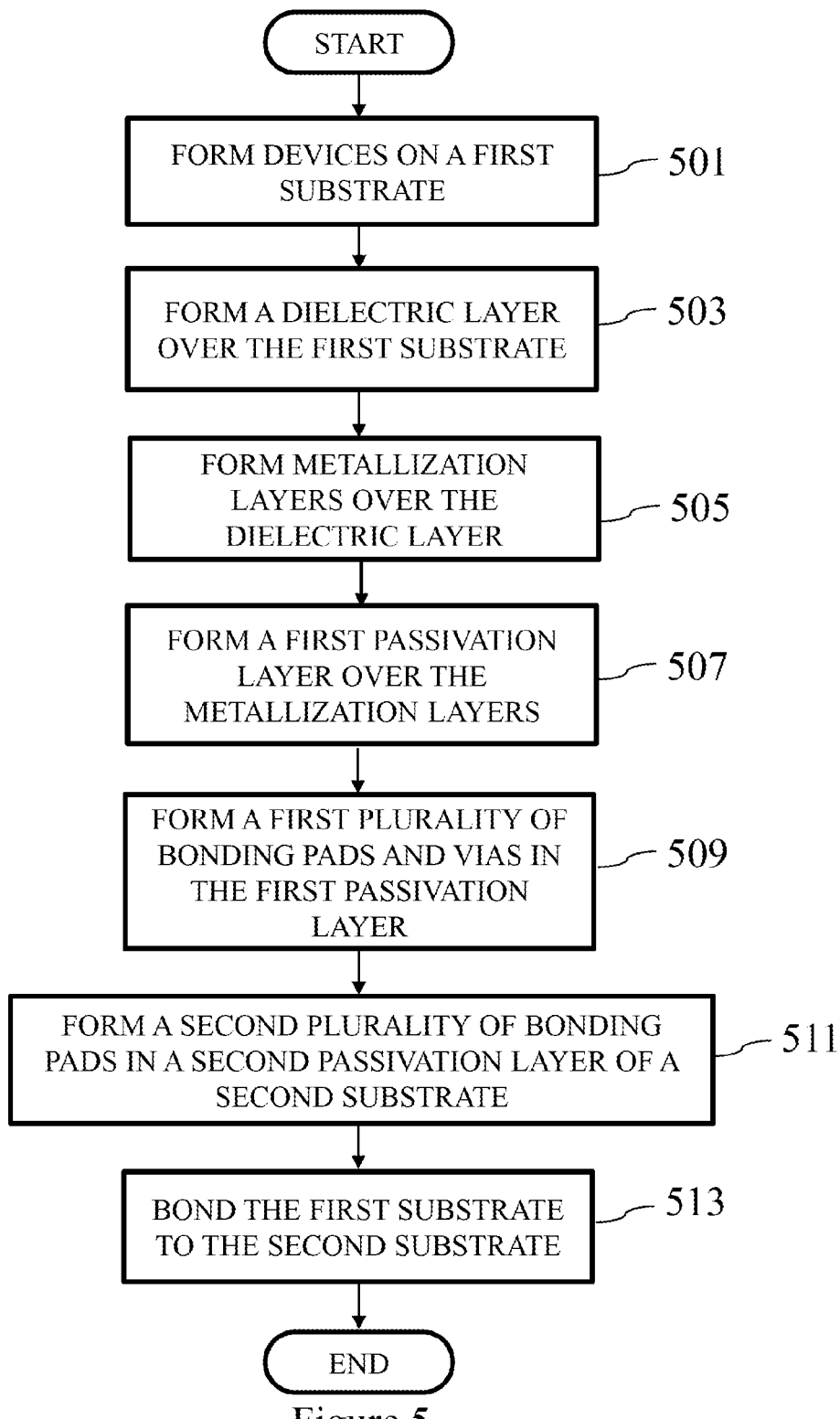
FIG. 5 is a flowchart illustrating a semiconductor device fabrication method in accordance with some embodiments.

FIG. 5 is a flowchart illustrating a method that may be performed to manufacture a semiconductor device in accordance with an embodiment. The method begins at step 501, wherein devices are formed in a first substrate as illustrated in FIG. 1. In step 503, a dielectric layer is formed over the first substrate as illustrated in FIG. 1. In further reference to FIG. 1, in step 505, metallization layers are formed over the dielectric layer. In step 507, a first passivation layer is formed over the metallization layers as illustrated in FIG. 1. In step 509, a first plurality of bonding pads and vias are formed in the first passivation layer as illustrated in FIG. 1, wherein the vias provide electrical contact between some of the first plurality of bonding pads and the metallization layers. In step 511, a second plurality of bonding pads are formed in a second passivation layer of a second substrate as illustrated in FIG. 2. Finally, in step 513, the first substrate is bonded to a second substrate using a hybrid bonding method as illustrated in FIG. 3.

In an embodiment, a semiconductor device comprises, a first structure, which further comprises a first substrate, a first metallization layer over the first substrate, a first passivation layer over the first metallization layer, and a first conductive pad in the first metallization layer. The first structure further comprises a first bonding pad and a first via between the first bonding pad and the first conductive pad in the first passivation layer, the first bonding pad and the first via being in direct electrical contact, and the first via and the first conductive pad being in direct electrical contact. The semiconductor device further comprises a second structure directly bonded to the first structure. The second structure comprises a second substrate, a second metallization layer over the second substrate, a second passivation layer over the second metallization layer, and a second conductive pad in the second metallization layer. The second structure further comprises a second bonding pad in the second passivation layer, the second bonding pad being in direct electrical contact with the second conductive pad. The second structure is bonded to the first structure such that the first bonding pad and the second bonding pad are aligned with respect to each other.

In another embodiment, a semiconductor device comprises a first structure, which further comprises a first substrate, a first plurality of metallization layers over the first substrate, and a first passivation layer over the first plurality of metallization layers. The first structure further comprises a first plurality of conductive pads in a topmost metallization layer of the first plurality of metallization layers, a first plurality of bonding pads and a first plurality of vias in the first passivation layer, wherein each of the vias provides direct electrical contact between respective ones of the first plurality of bonding pads and the first plurality of conductive pads. The semiconductor device further comprises a second structure directly bonded to the first structure. The second structure comprises a second substrate, a second plurality of metallization layers over the second substrate, and a second passivation layer over the second plurality of metallization layers. The second structure further comprises a second plurality of conductive pads in a topmost metallization layer of the second plurality of metallization layers, and a second plurality of bonding pads in the second passivation layer, each of the second plurality of bonding pads being in direct electrical contact with respective ones of the second plurality of conductive pads. The second structure is bonded to the first structure such that the first plurality of bonding pads and the second plurality of bonding pads are aligned with respect to each other.

In yet another embodiment, a method of fabrication of a semiconductor device, the method comprises providing a first substrate, forming a first metallization layer over the first substrate, forming a first conductive pad in the first metallization layer, forming a first passivation layer over the first metallization layer, and forming a first bonding pad and a first via in the first passivation layer, the first via being in direct physical contact with the first bonding pad and the first conductive pad. The method further comprises providing a second substrate, forming a second metallization layer over the second substrate, forming a second conductive pad in the second metallization layer, forming a second passivation layer over the second metallization layer, forming a second bonding pad in the second passivation layer, the second bonding pad being in direct physical contact with the second conductive pad, and bonding the first substrate to the second substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
    a first structure comprising:
        a first substrate having a first side, the first substrate comprising a first semiconductor substrate;
        a first metallization layer on the first side of the first substrate;
        a first passivation layer on the first metallization layer;
        a first conductive pad in the first metallization layer; and
        a first bonding pad and a first via in the first passivation layer, the first via being interposed between the first bonding pad and the first conductive pad, the first bonding pad and the first via being in direct electrical contact, and the first via and the first conductive pad being in direct electrical contact;
    a second structure directly bonded to the first structure, the second structure comprising:
        a second substrate having a second side, the second side facing the first side, the second substrate comprising a second semiconductor substrate;
        a second metallization layer on the second side of the second substrate;
        a second passivation layer on the second metallization layer;
        a second conductive pad in the second metallization layer; and
        a second bonding pad in the second passivation layer, the second bonding pad being in direct electrical contact with the second conductive pad; and
    wherein the second structure is bonded to the first structure such that the first bonding pad and the second bonding pad are aligned with respect to each other.

2. The semiconductor device of claim 1, further comprising a third bonding pad in the first passivation layer, the third bonding pad being electrically isolated from the first metallization layer.

3. The semiconductor device of claim 1, further comprising a fourth bonding pad in the second passivation layer, the fourth bonding pad being electrically isolated from the second metallization layer.

4. The semiconductor device of claim 1, wherein the first bonding pad has a height between about 100 nm and about 900 nm, and a width between about 0.6 µm and about 3µm.

5. The semiconductor device of claim 1, wherein the first via has a height between about 100 nm and about 400 nm, and a width between about 0.1 µm and about 0.4 µm.

6. The semiconductor device of claim 1, wherein the first conductive pad has a height between about 90 nm and about 900 nm, and a width between about 0.09 µm and about 0.4 µm.

7. The semiconductor device of claim 1, wherein the first structure is bonded to the second structure using a hybrid bonding method.

8. A semiconductor device comprising:
    a first structure comprising:
        a first substrate having a first side, the first substrate comprising a semiconductor substrate;
        a first plurality of metallization layers on the first side of the first substrate;
        a first passivation layer on the first plurality of metallization layers;
        a first plurality of conductive pads in a topmost metallization layer of the first plurality of metallization layers; and a first plurality of bonding pads and a first plurality of vias in the first passivation layer, wherein each of the vias provides direct electrical contact between respective ones of the first plurality of bonding pads and the first plurality of conductive pads;

a second structure directly bonded to the first structure, the second structure comprising:
- a second substrate having a second side, the second side facing the first side;
- at least one active device on the second side of the second substrate;
- a second plurality of metallization layers on the second side of the second substrate;
- a second passivation layer on the second plurality of metallization layers;
- a second plurality of conductive pads in a topmost metallization layer of the second plurality of metallization layers; and
- a second plurality of bonding pads in the second passivation layer, each of the second plurality of bonding pads being in direct electrical contact with a respective one of the second plurality of conductive pads; and wherein the second structure is bonded to the first structure such that the first plurality of bonding pads and the second plurality of bonding pads are aligned with respect to each other.

9. The semiconductor device of claim 8, further comprising one or more first dummy bonding pads in the first passivation layer.

10. The semiconductor device of claim 9, further comprising one or more second dummy bonding pads in the second passivation layer.

11. The semiconductor device of claim 8, wherein the first plurality of bonding pads have a height between about 100 nm and about 900 nm, and a width between about 0.6 μm and about 3 μm.

12. The semiconductor device of claim 8, wherein the first plurality of vias have a height between about 100 nm and about 400 nm, and a width between about 0.1 μm and about 0.4 μm.

13. The semiconductor device of claim 8, wherein the first plurality of conductive pads have a height between about 90 nm and about 900 nm, and a width between about 0.09 μm and about 0.4 μm.

14. The semiconductor device of claim 8, wherein the first structure is bonded to the second structure using a hybrid bonding method.

15. A method of fabrication of a semiconductor device, the method comprising:
- forming a first metallization layer over a first substrate;
- forming a first conductive pad in the first metallization layer;
- forming a first passivation layer over the first metallization layer;
- forming a first bonding pad and a first via in the first passivation layer, the first via being in direct physical contact with the first bonding pad and the first conductive pad;
- forming a second metallization layer over a second substrate;
- forming a second conductive pad in the second metallization layer;
- forming a second passivation layer over the second metallization layer;
- forming a second bonding pad in the second passivation layer, the second bonding pad being in direct physical contact with the second conductive pad; and
- after forming the first bonding pad, the first via and the second bonding pad, bonding the first substrate to the second substrate.

16. The method of claim 15, further comprising forming a first dummy bonding pad in the first passivation layer.

17. The method of claim 16, further comprising forming a second dummy bonding pad in the second passivation layer.

18. The method of claim 15, wherein the first bonding pad has a height between about 100 nm and about 900 nm, and a width between about 0.6 μm and about 3 μm.

19. The method of claim 15, wherein the first via has a height between about 100nm and about 400 nm, and a width between about 0.1 μm and about 0.4 μm.

20. The method of claim 15, wherein the first conductive pad has a height between about 90 nm and about 900 nm, and a width between about 0.09 μm and about 0.4 μm.

* * * * *